United States Patent [19]

Park

[11] Patent Number: 5,771,398
[45] Date of Patent: Jun. 23, 1998

[54] INTERFACE DEVICE FOR HAVING FIRST PORT CONTROL MEANS TO CONTROL DRIVE HAVING FAST ACCESS AND SECOND PORT CONTROL MEANS FOR DRIVE WITH SLOW ACCESS

[75] Inventor: Sung-joon Park, Kyunggi-do, Rep. of Korea

[73] Assignee: SamSung Electronics Co., Ltd., Suwon, Rep. of Korea

[21] Appl. No.: 622,137

[22] Filed: Mar. 27, 1996

[30] Foreign Application Priority Data

Mar. 28, 1995 [KR] Rep. of Korea ..................... 1995-6757

[51] Int. Cl.[6] .................................................. G06F 13/00
[52] U.S. Cl. ......................... 395/858; 395/834; 395/892
[58] Field of Search ............................... 364/239, 236.2; 395/500, 800, 821

[56] References Cited

U.S. PATENT DOCUMENTS

| 5,235,689 | 8/1993 | Baker et al. | 395/309 |
| 5,239,445 | 8/1993 | Parks et al. | 361/686 |
| 5,295,247 | 3/1994 | Chang et al. | 395/309 |
| 5,434,722 | 7/1995 | Bizjak et al. | 360/69 |
| 5,581,715 | 12/1996 | Verinsky et al. | 395/309 |
| 5,581,716 | 12/1996 | Park | 395/309 |

*Primary Examiner*—Thomas C. Lee
*Assistant Examiner*—Anderson I. Chen
*Attorney, Agent, or Firm*—Robert E. Bushnell, Esq.

[57] ABSTRACT

An interface device using a plurality of IDE Ports is disclosed, in which, in order to process signals of drives having different access times, separate IDE ports are added, so that different IDE ports can be selected in accordance with the respective access times. The interface device has an IDE controller for outputting control signals to control data input and output operations for a drive having a fast access time, a first IDE port with its operation state shifted in accordance with the control signals of the first IDE controller, so as to transmit input and output data, a data transmission path and an address area being assigned in accordance with the state of the input and output data signals, a second IDE controller for outputting control signals to control data input and output operations for a drive having a slow access time, and a second IDE port with its operation state shifted in accordance with the control signals of the second IDE controller, so as to transmit input and output data, a data transmission path and an address area being assigned in accordance with the state of the input and output data signals.

13 Claims, 3 Drawing Sheets

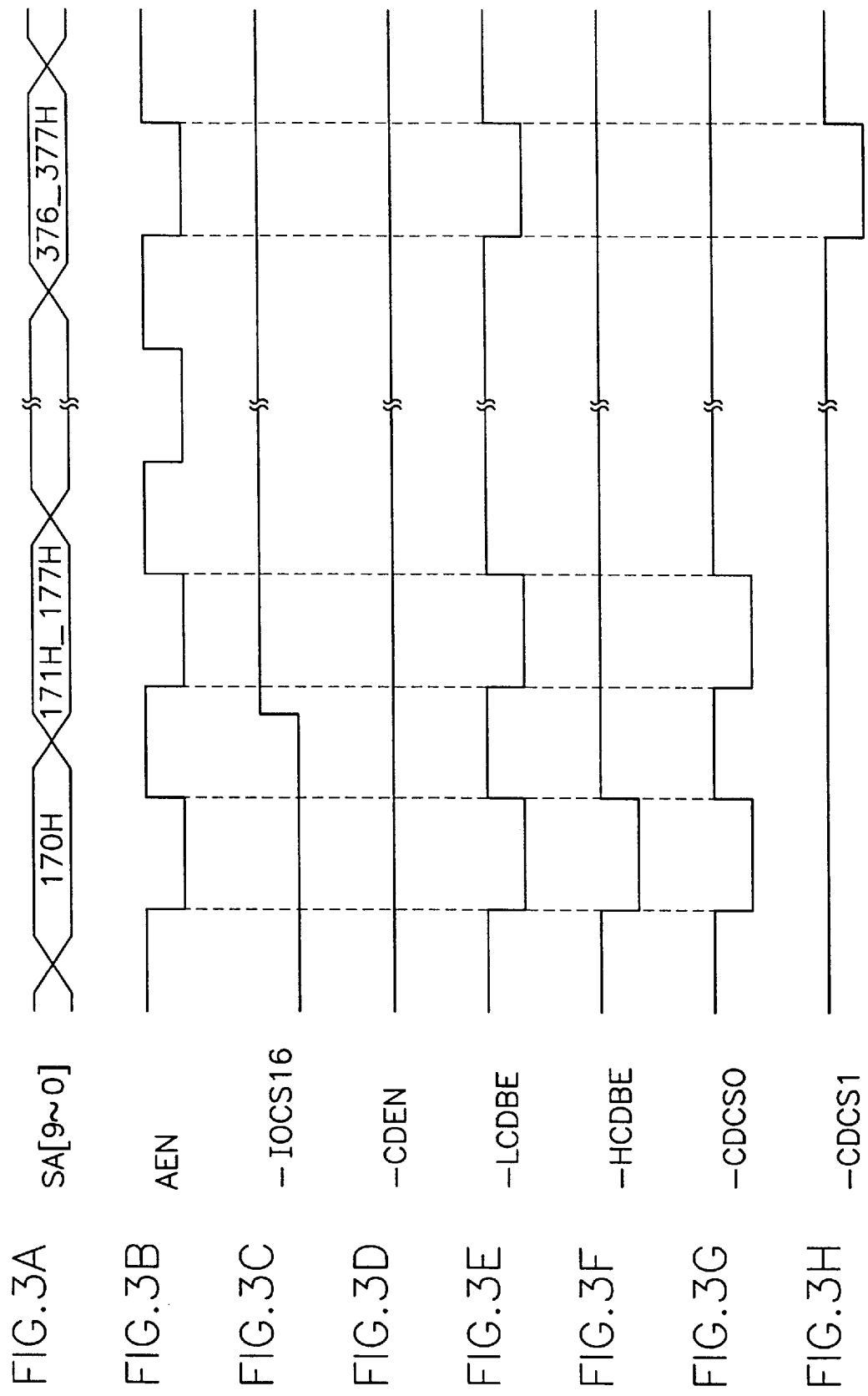

INTERFACE DEVICE FOR HAVING FIRST PORT CONTROL MEANS TO CONTROL DRIVE HAVING FAST ACCESS AND SECOND PORT CONTROL MEANS FOR DRIVE WITH SLOW ACCESS

BACKGROUND OF THE INVENTION

1. Field of the Invention

The present invention relates to an interface device using a plurality of integrated drive electronics (IDE) ports. Particularly the present invention relates to interface device using a plurality of IDE ports, in which, in order to process signals of drives having different access times, separate IDE ports are added, so that different IDE ports can be selected in accordance with the respective access times.

2. Description of the Prior Art

Generally, an IDE port is a disc drive interface, and electronic circuits are stored within the disc drive. Therefore, a separate device for controlling the interface is not required.

Accordingly, when IDE ports are used as an interface of a disc drive, the address of the input/output port has to be divided.

Therefore, in a hard disc drive (HDD) in which the access time is fast (13–17 ms), or in a CD ROM (compact disc read only memory) drive in which the access time is slow compared to that of the hard disk drive, when relevant data signals are processed, the data signals are input into relevant assigned address area of the IDE port in accordance with appropriate address signals.

Therefore, when different drives having different access time are installed, the IDE interface device processes signals for individual ones of the different drives, and thus, processes signals for a hard disc drive and a CD ROM drive in an alternate manner.

The conventional IDE interface device includes an IDE control section for outputting relevant control signals in accordance with the state of incoming address signals. First and second buffers store incoming data signals so as to output the data in accordance with enable signals of the IDE control section. An IDE port, having different addressable I/O ports, interfaces appropriate data into the ports address areas selected in accordance with the control signals of the IDE control section, the data being selected from among the output data of the first and second buffers.

The conventional IDE interfacing device constituted as described above operates in the following manner.

When the data signals are input through data buses into a hard disc drive or a CD ROM drive, the IDE control section controls the state of first and second chip select signals in accordance with the state of the address signals for assigning divided address areas for the IDE port and for generating first and second buffer enable signals.

When the first and second data buffers are selected by the first and second buffer enable signals output by IDE control section, the data signals are supplied through the first and second data buffers to a device which is connected to the address areas of the IDE port.

The address areas have been separated into a master area and a slave area, and therefore, the IDE port operates in such a manner that the address areas should be selected by first and second chip select signals in accordance with the values of address signals input into the IDE control section.

Therefore, the IDE port operates in such a manner that the data from the first and second data buffers are processed by being input into the master area and the slave area respectively in accordance with the state of the first and second chip select signals of the IDE control section.

When the data signals are input through the relevant addresses of the IDE port in accordance with the state of the address signals, and a hard disc drive and a CD ROM drive having different access times are installed to be simultaneously used, the interface device accesses the drives in an alternate manner.

Therefore, the respective signals for processing the data signals which are input from the hard disc drive or the CD ROM drive are supplied through the same signal line to the IDE control section or to the IDE port.

When drives having different access times are used, the output efficiency (throughput) such as the data processing time through the IDE interface device is decreased due to the fact that much time is consumed in processing the data of the drive having a slow access time.

SUMMARY OF THE INVENTION

The present invention is intended to overcome the above described disadvantage of the conventional technique.

It is therefore an object of the present invention to provide an improved interface and process for using a plurality of integrated drive electronics ports.

It is another object to provide an interface device using a plurality of IDE ports, in which, when drives having different accessing times are simultaneously used, the respective IDE ports are used to process the data signals separately in accordance with the access time.

These and other objects may be attained with an IDE controller for generating control signals to control data input and output operations for a drive having a fast access time, a first IDE port with its operation state shifted in accordance with the control signals of the first IDE controller, so as to transmit input and output data, a data transmission path and an address area being assigned in accordance with the state of the input and output data signals, a second IDE controller for outputting control signals to control data input and output operations for a drive having a slow access time, and a second IDE port with its operation state shifted in accordance with the control signals of the second IDE controller, so as to transmit input and output data, a data transmission path and an address area being assigned in accordance with the state of the input and output data signals.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3A–3H are timing charts for the operation of the second IDE port control section as performed according to the principles of the present invention.

DESCRIPTION OF THE PREFERRED EMBODIMENT

Figure 1:
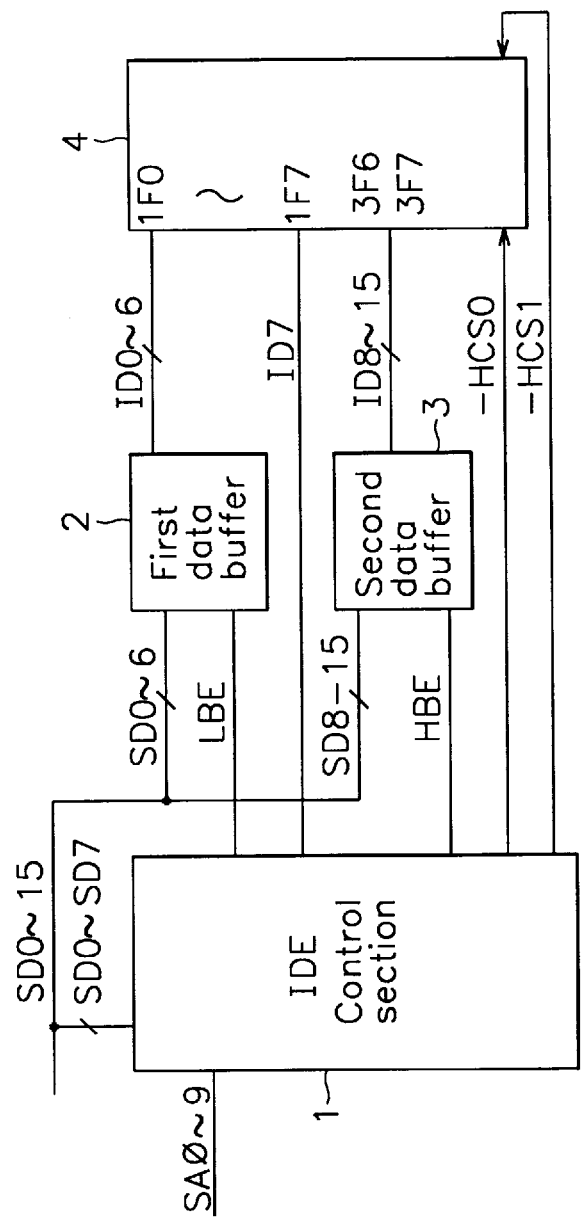
FIG. 1 is a schematic block diagram showing an abstract illustration of the salient features of the architecture of a hypothetical representation of a conventional interface device using an IDE port.

As shown in FIG. 1, an IDE interface device has an IDE control section 1 for outputting relevant control signals in accordance with the state of incoming address signals SA0–SA9, data buffers 2 and 3 for storing incoming data signals so as to output the data (which are stored in an operation-enable state) in accordance with the control signals of the IDE control section 1, and an IDE port 4 for interfacing relevant data ID0–ID6, ID7, and ID8–ID15 into address areas selected in accordance with the control signals of IDE control section 1, the relevant data being selected from among the output data of data buffers 2 and 3. When the relevant data signals SD0–SD15 are input through data buses into a hard disc drive or a CD ROM drive, IDE control section I controls the state of chip select signals -HCS0 and -HCSI in accordance with the state of the address signals SA0–SA9 for assigning divided address areas for IDE port 4, and outputs buffer enable signals LBE and HBE.

When data buffers 2 and 3 are respectively selected by buffer enable signals LBE and HBE output by the IDE control section 1, the relevant data signals are supplied through data buffers 2 and 3 to a device (CD-ROM or HDD) which is connected to the address area of IDE port 4.

The address areas of 1F0–1F7 and the address areas of 3F6–3F7 of IDE port 4 have been separated into a master area and a slave area, and therefore, IDE port 4 operates in a manner where relevant address areas are selected by chip select signals -HCS0 and -HCS1 in accordance with the values of address signals SA0–SA9 applied to IDE control section 1.

Therefore, IDE port 4 operates in a manner where data from data buffers 2 and 3 are processed by being input into the master area and the slave area, respectively, in accordance with the state of chip select signals -HCS0 and -HCSI of IDE control section 1.

When data signals are input through the relevant addresses of IDE port 4 in accordance with the state of address signals SA0–SA9, and a hard disc drive and a CD ROM drive (neither being shown), which have different access times, are installed to be simultaneously used, the interface device of FIG. 1 accesses the relevant drives in an alternate manner.

Therefore, the respective signals for processing the relevant data signals SD0–SD15 which are input from the hard disc drive or the CD ROM drive are supplied through the same signal line to IDE control section 1 or to IDE port 4.

When drives having different access times are used, the output efficiency (throughput), such as data processing time, through the IDE interface device of FIG. 1 is decreased due to the fact that much time is consumed in processing the data of the drive having a slow access time.

Figure 2:
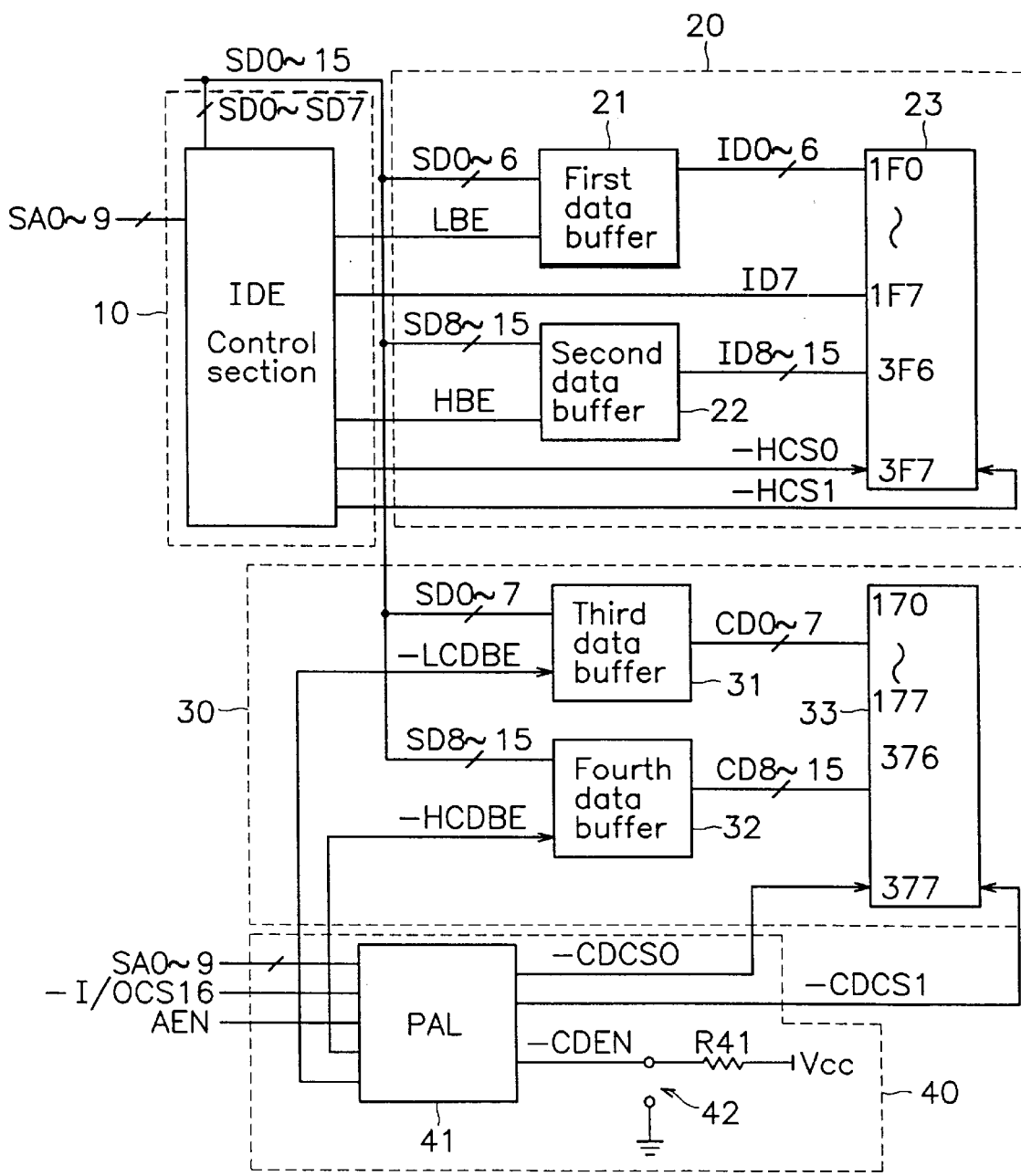
FIG. 2 is a block diagram showing the architecture of an interface device using a plurality of IDE ports constructed according to the principles of the present invention.

Referring to FIG. 2, the interface device constructed according to the principles of the present invention has increased efficiency. The interface device of FIG. 2 has a first IDE control section 10 for controlling the data input and output state and the relevant address areas in accordance with incoming address signals SA0–SA9, a first IDE port section 20 having operation states shifted in accordance with control signals -HCS0 AND -HCS1 output by first IDE control section 10 in order to transmit data from a drive having a fast access time, a second IDE port section 30 for transmitting data from a drive having a slow access time, and a second IDE port control section 40 outputting control signals -CDCSO AND -CDCS1 for controlling the operation states of second IDE port section 30.

First IDE control section 10 outputs buffer enable signals LBE and HBE, data signal ID7 and control signals -HCS0 and -HCS1 in response to received address signals SA0–SA9 and data signals SD0–SD7. First IDE port section 20 has data buffers 21 and 22 for receiving data signals SD0–SF6 and SD8–SD15, respectively, through data busses, and for receiving buffer enable signals LBE and HBE, respectively, from first IDE control section 10. First IDE port section 20 also has an IDE port 23 for receiving data signals ID0–ID6 and ID8–ID15, respectively, from data buffers 21 and 22, and for receiving data signal ID7 from IDE control section 10. IDE port 23 also receives chip select signals -HCSO and -HCSI from the IDE control section 10.

Second IDE port section 30 incorporates data buffers 31 and 32 for receiving data signals SD0–SD7, and SD8–SD15, respectively, through data busses, and an IDE port 33 for receiving data CD0–CD7 and CD8–CD15 respectively output from data buffers 31 and 32.

Second IDE port control section 40 incorporates a programmable array logic (PAL) 41 for generating buffer enable signals -LCDBE and -HCDBE for data buffers 31 and 32, respectively, and for generating chip select signals -CDCS0 and -CDCS1 for the IDE port 33, in accordance with the states of input address signals SA0–SA9, input and output chip select signal -I/OCS16, and address enable signal AEN. Second IDE port control section 40 has a jumper 42 and a resistor R41 with one of its terminals connectable to jumper 42, and with another of its terminals connected to a power source Vcc, for providing an enable signal to terminal -CDEN for controlling the operating state of PAL 41.

The interface device of FIG. 2, as described above, operates in the following manner. First, when a hard disc drive and a CD ROM drive (neither of which are shown) having different access times are installed and simultaneously used, the user connects jumper 42 of second IDE port control section 40 to resistor R41 in order for a low signal to be provided to enable terminal -CDEN, thereby enabling PAL 41 so second IDE port section 30 can be operated. When only one of a hard disc drive and a CD ROM drive is used, however, jumper 42 of second IDE port control section 40 is not connected to resistor R41, so that a high signal is applied to enable terminal -CDEN, thereby disabling PAL 41 so that only first IDE port section 20 can be driven.

Therefore, when a hard disc drive and a CD ROM drive having different access times are simultaneously used, in order to improve the data processing efficiency, jumper 42 of second IDE port control section 40 is connected. For this case, the operation of PAL 41 will be described below.

When a low enable signal is input to enable terminal -CDEN, as described above, the signal states of -LCDBE, -HCDBE, -CDCS0, and -CDCS1 are controlled by the PAL 41 in accordance with the states of the address enable signal AEN, the input and output chip select signal -I/OCS16 and the address signals SA0–SA9.

In the present invention, the programmable array logic equations for setting the output states and for defining the address areas of PAL 41, which is used as an address decoder, are as follows:

STRING ASSIGNMENTS

STRING 170_177H'/SA9*SA8*/SA7*SA6*SA5*SA4*/SA3'
STRING 376_377H'/SA9*SA8*/SA7*SA6*SA5*SA4*SA3*SA2*SA1'
STRING 170H'/SA9*SA8*/SA7*SA6*SA5*SA4*SA3*/SA2*/SA1*/SA0'

BOOLEAN EQUATION SEGMENT
Equations $$-LCDBE = -CDEN*/AEN*-IOCS16*(170\_177H + 376\_377H)$$

$$-HCDBE = -CDEN*/AEN*-IOCS16*170H$$

$$-CDCS1 = -CDEN*/AEN*376\_377H$$

$$-CDCD0 = -CDEN*/AEN*170\_177H$$

The above equations are set in PAL 41, and therefore, the address terminals SA0–SA9 of the PAL 41 receive address signals SA0–SA9 which correspond to the values of 170_177H or 376_377H as shown in FIG. 3A.

Thus, when a low level signal, as shown in FIG. 3D, is input into the -CDEN enable terminal of PAL 41 of second IDE port control section 40, PAL 41 is shifted in accordance with the address enable signal AEN, the input and output chip select signal -I/OCS16 and the address signals SA0–SA9.

Therefore, when CD-ROM address signals SA0–SA9 corresponding to 170_177H or 376_377H are input into the address terminals of PAL 41, and when the incoming address enable signal AEN is a low level signal, as shown in FIG. 3B, then the PAL 41 shifts the state of buffer enable signal -LCDBE to a low level "L" as shown in FIG. 3E, regardless of state of the input and output chip select signal -I/OCS16, thereby enabling buffer 31.

When the address signals SA0–SA9 corresponding to 170H are input into the address terminals of PAL 41, the number of bits of the data which are processed in the 170H address area becomes 18 bits. Therefore, the values of the address signals SA0–SA9 correspond to 170H are input to PAL 41 in order to process the sixteen-bit data signals SD0–SD15, and buffers 31 and 32 are both selected. For this purpose, the input and output chip select signals -I/OCS16 are shifted to an active low level "L" as shown in FIG. 3C, which indicates processing of a sixteen-bit data signal is to be performed. Therefore, owing to the input and output chip select signals -I/OCS16, not only is buffer enable signal -LCDBE output, but also buffer enable signal -HCDBE is output with a low level, as shown in FIG. 3F, so that buffers 31 and 32 would be shifted to an enabled state, and PAL 41 shifts the chip select signal -CDCS0 to a low level "L", as shown in FIG. 3G, so that a master area can be selected from among the address areas of IDE port 33.

When the address signals SA0–SA9 which are input into the address terminals correspond to 170_177H then the PAL 41 shifts the chip select signal -CDCS0 to a low level "L", so that a master area can be selected from among the address areas of IDE port 33. When the address signals SA0–SA9 correspond to 376_377H, however, PAL 41 shifts chip select signal -CDCS1 to a low level, as shown in FIG. 3H, so that a slave area can be selected from among the address areas of IDE port 33.

When the values of the address signals SA0–SA9, which are input into the address terminals of the PAL 41, correspond to 171_177H, and when AEN is low "L" and -I/OCS16 is high "H", then -LCDBE AND -CDCS0 are low "L" so that data buffer 31 is enabled and the data signals are processed through the master area of IDE Port 33.

When the address signals SA0–SA9, which are input into the address terminals of the PAL 41, correspond to 376_377H, and when AEN is low "L" and -I/OSC16 is high "H", data buffer 31 is enabled by the low level of -LCDBE, and the data signals from buffer 31 are processed through the slave area of IDE port 33 according to the low level of -CDCS1.

Thus, when jumper 42 is turned on, i.e., connected to resistor 41, by the user, the output state of the PAL 41 is shifted in accordance with the address signals SA0–SA9 and signals AEN and -I/OCS16, thereby controlling the state of second IDE port section 30.

Thus, when jumper 42 is connected, second IDE port section 30 is selected through the operation of IDE port control section 40 when address data for a CD-ROM (not shown) is received, and the operation state of first IDE port section 20 is operated as known for when address data for a hard disk drive (not shown) is received. Like the operation of IDE port control section 40, first IDE port section 20 shifts buffer enable signals LBE and HBE and chip select signals -HCS0 and -HCS1 in accordance with the address signals SA0–SA9 which are input into the IDE control section 10. Therefore, data signals SD0–SD15 which are output from the hard disc drive and which are input through the data buses are transmitted through data buffers 21 or 22 of first IDE port section 20 to the address areas IF0_1F7 and 3F6_3F7 of IDE port 23. Accordingly, the data signals which are input through data buses SD0–SD15 are processed by first and second IDE port sections 20 and 30.

As described above, in accordance with the operations of IDE control section 10 and second IDE port control section 40, the data signals SD0–SD15 which are input from a hard disc drive or a CD-ROM drive having different access times are outputted through the relevant first and second IDE port sections 20 and 30.

Therefore, when a plurality of drives are installed and used, IDE ports can be additionally installed and used based on the above described method.

According to the present invention as described above, when a plurality of drives having different access times are installed and used, different IDE ports are assigned to different drives, and therefore, the lowering of the data processing efficiency which is caused during the processing of slow access data can be prevented.

What is claimed is:

1. An integral interface device using a plurality of integrated drive electronics ports, comprising:

first integrated drive electronics port control means for outputting control signals to control a data input and output operation for data for a drive having a fast access time;

first integrated drive electronics port means having an operation state shifted in accordance with said control signals of said first integrated drive electronics port control means, so as to transmit input and output data signals, a data transmission path and an address area being assigned in accordance with the state of said input and output data signals;

second integrated drive electronics port control means for outputting control signals to control data input and output operations for data for a drive having a slow access time; and second integrated drive electronics port means having an operation state shifted in accordance with said control signals of said second integrated drive electronics port control means, so as to transmit input and output data signals, a data transmission path and an address area being assigned in accordance with the state of said input and output data signals.

2. The integral interface device as claimed in claim 1, wherein said second integrated drive electronics port means comprises:

first and second data buffers for receiving said input and output data signals through data buses, said input and output data signals being selected in accordance with states of first and second data buffer enable signals respectfully input from said second integrated drive electronics port control means; and an integrated drive electronics port for selecting relevant address areas in accordance with states of first and second chip select signals output by said second integrated drive electronics port control means for receiving output data of said first and second data buffers.

3. The integral interface device as claimed in claim 2, wherein said second integrated drive electronics port control means comprises:

programmable array logic means for generating said first and second data buffer enable signals and said first and second chip select signals; and switching means for controlling an enable state of said programmable array logic means.

4. The integral interface device as claimed in claim 3, wherein said switching means comprises a voltage source, a resistor coupled between said voltage source and an enable terminal of said programmable array logic means, and a jumper connectable by a user between said resistor and a ground potential, said resistor being connected to said ground potential through said jumper to enable said programmable array logic means to operate.

5. The integral interface device as claimed in claim 4, wherein a plurality of integrated drive electronics ports are added in accordance with additionally installed drives.

6. An integral interface device connectable to a plurality of integrated drive electronics drives, said interface device comprising:

a first integrated drive electronics port section connected to an integrated drive electronics drive having a first access time;

a second integrated drive electronics port section connected to an integrated drive electronics drive having a second access time, said second access time being slower than said first access time;

a first integrated drive electronics control section for controlling transmission of data through said first integrated drive electronics port section in response to received address data;

a second integrated drive electronics control section for controlling transmission of data through said second integrated drive electronics port section in response to said address data, a received address enable signal and an input and output chip select signal.

7. The integral interface device as set forth in claim 6, said second integrated drive electronics control section comprising:

programmable array logic means for generating first and second chip select signals and first and second data buffer enable signals in response to said address data, said address enable signal and said input and output chip select signal; and switching means for controlling an enable state of said programmable array logic means.

8. The integral interface device as set forth in claim 7, said switching means comprising a voltage source, a resistor coupled between said voltage source and an enable terminal of said programmable array logic means, and a jumper connectable by a user between said resistor and a ground potential, said resistor being connected to said ground potential through said jumper to enable said programmable array logic means to operate.

9. The integral interface device as set forth in claim 7, second integrated drive electronics port section comprising:

a first data buffer connected to receive a first plurality of bits of said data, said first data buffer being enabled in response to said first data buffer enable signal;

a second data buffer connected to receive a second plurality of bits of said data, said second data buffer being enabled in response to said second data buffer enable signal; and an integrated drive electronics port having a master address area and a slave address area, said master address area being connected to said first data buffer and said slave address area being connected to said second data buffer, said master address area being selected in response to said first chip select signal and said slave address area being selected in response to said second chip select signal.

10. The integral interface device as set forth in claim 9, said first chip select signal being generated when said address data corresponds to said master address area, said master address area having addresses between 170H and 177H, said second chip select signal being generated when said address data corresponds to said slave address area, said slave address area s having addresses between 376H and 377H.

11. The integral interface device as set forth in claim 9, said first and second data buffer enable signal and said first chip select signal being generated when said address data corresponds to said master address area, said master address area having addresses of 170H, said address enable signal has a low logic value and said input and output chip select signal has a low logic value.

12. The integral interface device as set forth in claim 9, said first data buffer enable signal and said first chip select signal being generated when said address data corresponds to said master address area, said master address area having addresses between 171H and 177H, said address enable signal has a low logic value and said input and output chip select signal has a high logic value.

13. The integral interface device as set forth in claim 9, said first data buffer enable signal and said second chip select signal being generated when said address data corresponds to said slave address area, said address enable signal has a low logic value and said input and output chip select signal has a high logic value.

* * * * *